United States Patent
Choi et al.

(10) Patent No.: US 9,774,011 B2
(45) Date of Patent: Sep. 26, 2017

(54) ORGANIC LIGHT-EMITTING DIODE (OLED) DISPLAY

(71) Applicant: Samsung Display Co., Ltd., Yongin-si, Gyeonggi-Do (KR)

(72) Inventors: Haeyun Choi, Yongin-si (KR); Jaeik Lim, Yongin-si (KR); Jinwoo Choi, Yongin-si (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/090,422

(22) Filed: Apr. 4, 2016

(65) Prior Publication Data

US 2016/0218325 A1 Jul. 28, 2016

Related U.S. Application Data

(63) Continuation of application No. 14/609,279, filed on Jan. 29, 2015, now Pat. No. 9,318,726.

(30) Foreign Application Priority Data

Sep. 1, 2014 (KR) .................. 10-2014-0115691

(51) Int. Cl.
| | |
|---|---|
| *H01L 29/08* | (2006.01) |
| *H01L 29/18* | (2006.01) |
| *H01L 33/00* | (2010.01) |
| *G01B 7/28* | (2006.01) |
| *H01L 51/52* | (2006.01) |
| *H01L 27/32* | (2006.01) |

(52) U.S. Cl.
CPC ........ *H01L 51/5275* (2013.01); *H01L 27/322* (2013.01); *H01L 51/5253* (2013.01);
(Continued)

(58) Field of Classification Search
CPC ............ H01L 51/5275; H01L 51/5253; H01L 51/5271; H01L 51/5284; H01L 27/322;
(Continued)

(56) References Cited

U.S. PATENT DOCUMENTS 5,555,476 A * 9/1996 Suzuki .................. G02B 3/005
349/110
2004/0262615 A1 12/2004 Cok
(Continued)

FOREIGN PATENT DOCUMENTS

| JP | 2000-199803 A | 7/2000 |
|---|---|---|
| JP | 2004-021209 A | 1/2004 |
| KR | 10-2007-0049007 A | 5/2007 |
| KR | 10-2014-0014685 A | 2/2014 |

*Primary Examiner* — Dzung Tran
(74) *Attorney, Agent, or Firm* — Knobbe Martens Olson & Bear LLP (57) ABSTRACT

An organic light-emitting diode (OLED) display is disclosed. In one aspect, the display includes an OLED layer including a plurality of OLEDs that respectively form a plurality of sub-pixels and an encapsulation layer disposed over the OLED layer. The OLED display also includes an optical film disposed over the encapsulation layer and comprising a reflection control layer, a first lens disposed below the reflection control layer, and a second lens disposed over the reflection control layer, wherein the reflection control layer comprises i) a plurality of color filters respectively corresponding to the sub-pixels, and ii) a light shielding portion disposed between the color filters. The OLED display further includes an intermediate layer disposed between the encapsulation layer and the optical film, wherein the first lens is disposed over sides of at least one sub-pixels and wherein the second lens is disposed over center portions of selected sub-pixels.

18 Claims, 5 Drawing Sheets

(52) U.S. Cl.
 CPC ...... *H01L 51/5271* (2013.01); *H01L 51/5284* (2013.01); *H01L 27/3211* (2013.01); *H01L 2251/5315* (2013.01); *H01L 2251/5338* (2013.01); *H01L 2251/558* (2013.01)

(58) Field of Classification Search
 CPC ......... H01L 27/3211; H01L 2251/3211; H01L 2251/3215; H01L 2251/5315
 USPC ......... 257/40, 88, 98, E51.026, 59; 313/504; 349/106
 See application file for complete search history.

(56) References Cited

U.S. PATENT DOCUMENTS

| | | | |
|---|---|---|---|
| 2005/0002105 A1* | 1/2005 | Nemoto | B29D 11/00278 359/619 |
| 2005/0231085 A1* | 10/2005 | Song | H01L 51/5275 313/110 |
| 2007/0077349 A1* | 4/2007 | Newman | B82Y 20/00 427/66 |
| 2007/0115422 A1 | 5/2007 | Lee et al. | |
| 2009/0073691 A1 | 3/2009 | Shibasaki et al. | |
| 2010/0019654 A1* | 1/2010 | Hayashi | H01L 51/5256 313/498 |
| 2010/0308571 A1* | 12/2010 | Steenblik | G02B 3/0031 283/72 |
| 2011/0062476 A1 | 3/2011 | Tobise | |
| 2012/0218173 A1 | 8/2012 | Ohta et al. | |
| 2014/0027724 A1 | 1/2014 | Lim et al. | |

\* cited by examiner

ORGANIC LIGHT-EMITTING DIODE (OLED) DISPLAY

CROSS-REFERENCE TO RELATED APPLICATIONS

This application is a continuation of U.S. patent application Ser. No. 14/609,279, filed on Jan. 29, 2015, which claims the benefit of Korean Patent Application No. 10-2014-0115691, filed on Sep. 1, 2014, in the Korean Intellectual Property Office, each disclosure of which is incorporated herein in its entirety by reference.

BACKGROUND

Field

The described technology generally relates to an organic light-emitting diode (OLED) display.

Description of the Related Technology

Recently, OLEDs have been highlighted for use as display devices that generate various types of images via selective light emission from a matrix of pixels.

An OLED display does not require a separate light source, unlike a liquid crystal display, and thus has a decreased thickness and weight. Also, OLED technology has high quality characteristics such as low power consumption, high brightness, and fast response time.

SUMMARY OF CERTAIN INVENTIVE ASPECTS

One inventive aspect is an OLED display.

Another aspect is an OLED display including a substrate; an organic light-emitting device layer formed on the substrate and including organic light-emitting devices that form a plurality of sub-pixels; an encapsulation layer on the organic light-emitting device layer; an optical film on the encapsulation layer and including a reflection control layer, a first lens formed below the reflection control layer, and a second lens formed on the reflection control layer, wherein the reflection control layer includes color filters respectively correspond to the plurality of sub-pixels, and a light shielding part that is formed between the color filters and includes a first opening; and an intermediate layer formed between the encapsulation layer and the optical film, wherein the first lens corresponds to sides of at least one sub-pixel among the plurality of sub-pixels, and the second lens corresponds to each of center portions of some sub-pixels among the plurality of sub-pixels.

The first lens may overlap a portion of the light shielding part.

A top surface of the intermediate layer may contact a bottom surface of the first lens.

The intermediate layer may have a low refractive index, and the first lens may have a high refractive index.

The plurality of sub-pixels may include a first sub-pixel, a second sub-pixel, and a third sub-pixel that respectively emit different lights, and the second lens may correspond to a center portion of at least one of the first sub-pixel and the second sub-pixel.

The second lens may not overlap the first lens.

The first opening may have a polygonal shape having at least four corners, and the first lens may be formed along at least two corners of the at least four corners of the first opening.

The first opening may have a quadrangular shape, and the first lens may be formed along two parallel corners from among corners of the first opening.

The first lens may have a convex surface protruding in an opposite direction of a travelling path of light emitted from the organic light-emitting device layer, and the second lens may have a convex surface protruding in a direction of the travelling path of the light.

A curvature of the convex surface of the second lens may be different from a curvature of the convex surface of the first lens.

An initial degree at an end of the first lens may be greater than about 40 degrees.

An initial degree at an end of the second lens may be greater than about 30 degrees.

Another aspect is an OLED display including an organic light-emitting device layer formed on a substrate and forming a first sub-pixel, a second sub-pixel, and a third sub-pixel; an encapsulation layer formed on the organic light-emitting device layer and including an organic layer and an inorganic layer that are alternately stacked; an optical film formed on the encapsulation layer and including a reflection control layer that includes a color filter formed on the first through third sub-pixels and a light shielding part located between the first through third sub-pixels and having a first opening, a first lens formed below the reflection control layer so as to be adjacent to the light shielding part, and a second lens formed on the reflection control layer; and an intermediate layer formed below the optical film so that a top surface thereof contacts a bottom surface of the first lens, wherein the first lens corresponds to at least one of the first through third sub-pixels, and the second lens corresponds to at least one of the first sub-pixel and the second sub-pixel.

The first lens may overlap a portion of the light shielding part.

The light shielding part may surround sides of each of the first through third sub-pixels, and the first lens may at least partially surround the sides of at least one of the first through third sub-pixels.

The second lens may correspond to a center portion of at least one of the first sub-pixel and the second sub-pixel.

The first opening may have a polygonal shape having at least four corners, and the first lens may be formed along at least two corners of the first opening.

The first lens may be formed along two parallel corners of the first opening.

The intermediate layer may have a low refractive index, and the first lens may have a high refractive index.

The second lens may have a convex surface protruding in a direction of a travelling path of light emitted from the organic light-emitting device layer, and the first lens may have a convex surface protruding in an opposite direction of the travel path of the light.

Another aspect is an organic light-emitting diode (OLED) display, comprising: a substrate; an OLED layer formed over the substrate and comprising a plurality of OLEDs that respectively form a plurality of sub-pixels; an encapsulation layer formed over the OLED layer; an optical film formed over the encapsulation layer and comprising a reflection control layer, a first lens formed below the reflection control layer, and a second lens formed over the reflection control layer, wherein the reflection control layer comprises i) a plurality of color filters respectively corresponding to the sub-pixels, and ii) a light shielding portion formed between the color filters and having a first opening; and an intermediate layer formed between the encapsulation layer and the optical film, wherein the first lens is formed over sides of at least one of the sub-pixels, and wherein the second lens is formed over center portions of selected ones of the sub-pixels.

In the above display, the first lens overlaps and contacts a portion of the light shielding portion. In the above display, a top surface of the intermediate layer contacts a bottom surface of the first lens. In the above display, the intermediate layer has a first refractive index, and wherein the first lens has a second refractive index greater than the first refractive index. In the above display, the sub-pixels comprise a first sub-pixel, a second sub-pixel, and a third sub-pixel configured to respectively emit different colors of light, and wherein the second lens is formed over a center portion of at least one of the first and second sub-pixels. In the above display, the second lens does not overlap the first lens. In the above display, the first opening has a polygonal shape having at least four corners, and wherein the first lens is formed along at least two of the four corners of the first opening. In the above display, the first opening has a quadrangular shape, and wherein the first lens is formed along two parallel corners of the first opening.

In the above display, the first lens has a convex surface extending in an opposite direction of a travelling path of light emitted from the OLED layer, and wherein the second lens has a convex surface extending in a direction of the travelling path of the light. In the above display, the curvature of the convex surface of the second lens is different from the curvature of the convex surface of the first lens. In the above display, an initial degree at an end of the first lens is greater than about 40 degrees. In the above display, an initial degree at an end of the second lens is greater than about 30 degrees.

Another aspect is an organic light-emitting diode (OLED) display, comprising: an OLED layer formed over a substrate and forming a first sub-pixel, a second sub-pixel, and a third sub-pixel; an encapsulation layer formed over the OLED layer and comprising an organic layer and an inorganic layer that are alternately stacked; an optical film formed over the encapsulation layer and comprising i) a reflection control layer, wherein the reflection control layer comprises a color filter formed over each of the first through third sub-pixels and a light shielding portion located between the sub-pixels and having a first opening, ii) a first lens formed below the reflection control layer so as to be adjacent to the light shielding portion, and iii) a second lens formed over the reflection control layer; and an intermediate layer formed below the optical film so that a top surface thereof contacts a bottom surface of the first lens, wherein the first lens is formed over at least one of the first through third sub-pixels, and wherein the second lens is formed over center portions of at least one of the first and second sub-pixels.

In the above display, the first lens overlaps and contacts a portion of the light shielding portion. In the above display, the light shielding portion surrounds sides of each of the first through third sub-pixels, and wherein the first lens at least partially surrounds the sides of at least one of the first through third sub-pixels. In the above display, the second lens does not overlap the first lens. In the above display, the first opening has a polygonal shape having at least four corners, and wherein the first lens is formed along at least two of the four corners of the first opening. In the above display, the first lens is formed along two parallel corners of the first opening. In the above display, the intermediate layer has a first refractive index, and wherein the first lens has a second refractive index greater than the first refractive index.

Another aspect is an organic light-emitting diode (OLED) display, comprising: a plurality of OLEDs respectively forming a plurality of sub-pixels; a plurality of color filters respectively formed over the sub-pixels; a plurality of sets of first lenses, each set formed between the corresponding OLED and the corresponding color filter, wherein each set of the first lenses contacts the corresponding color filter, wherein the number of the first lenses is greater than the number of the color filters; a plurality of second lenses formed over and contacting selected ones of the color filters, wherein the number of the color filters is greater than the number of the second lenses; and a plurality of light shielding layers each contacting two adjacent ones of the first lenses that contacting different color filters.

DETAILED DESCRIPTION OF CERTAIN INVENTIVE EMBODIMENTS

As the invention allows for various changes and numerous embodiments, particular embodiments will be illustrated in the drawings and described in detail in the written description. The effects and features of the present invention will now be described more fully with reference to the accompanying drawings, in which exemplary embodiments of the invention are shown. The invention may, however, be embodied in many different forms and should not be construed as being limited to the embodiments set forth herein.

Those components that are the same or are in correspondence are rendered the same reference numeral regardless of the figure number, and redundant explanations are omitted.

Throughout the specification, while such terms as "first," "second," etc., may be used to describe various components, such components must not be limited to the above terms. The above terms are used only to distinguish one component from another.

Throughout the specification, a singular form may include plural forms, unless there is a particular description contrary thereto.

Throughout the specification, terms such as "comprise" or "comprising" are used to specify existence of features and/or components described in the specification, not excluding the existence of one or more other features and/or one or more other components.

It will be understood that when a layer, an area, a component, or the like is referred to as being "on" another layer, area, or component can be directly on another layer, area, or component or intervening layer, area, or component may also be present.

In the drawings, the thicknesses of layers and regions are exaggerated for clarity. For example, the thicknesses and sizes of elements in the drawings are arbitrarily shown for convenience of description, thus, the spirit and scope of the present invention are not necessarily defined by the drawings.

Also, it should also be noted that in some alternative implementations, the steps of all methods described herein may occur out of the order. For example, two steps illustrated in succession may in fact be executed substantially concurrently or the two steps may sometimes be executed in the reverse order. In this disclosure, the term "substantially" includes the meanings of completely, almost completely or to any significant degree under some applications and in accordance with those skilled in the art. Moreover, "formed on" can also mean "formed over." The term "connected" includes an electrical connection.

Figure 1:
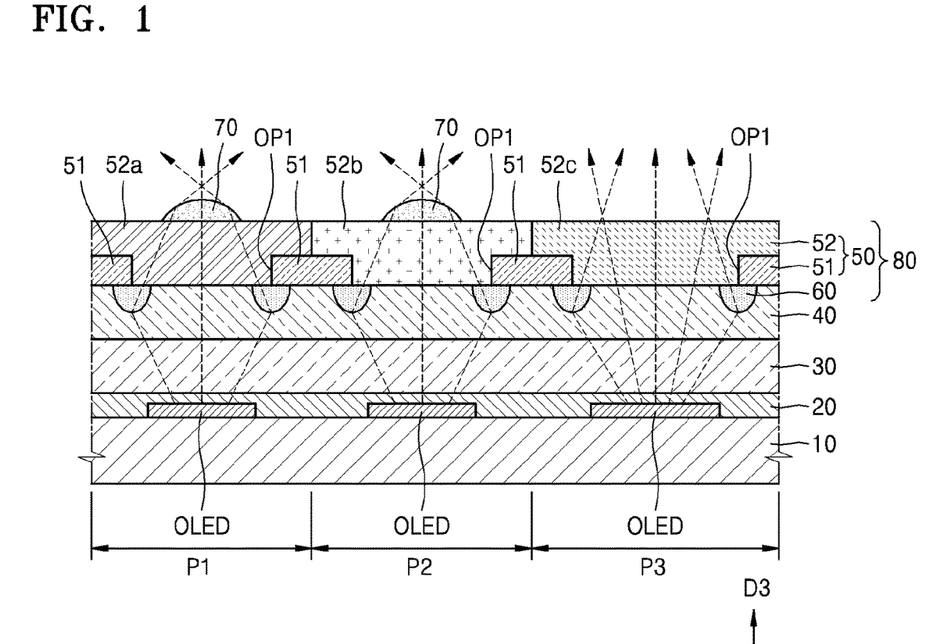
FIG. 1 is a cross-sectional view of an OLED display according to an embodiment.
Figure 2:
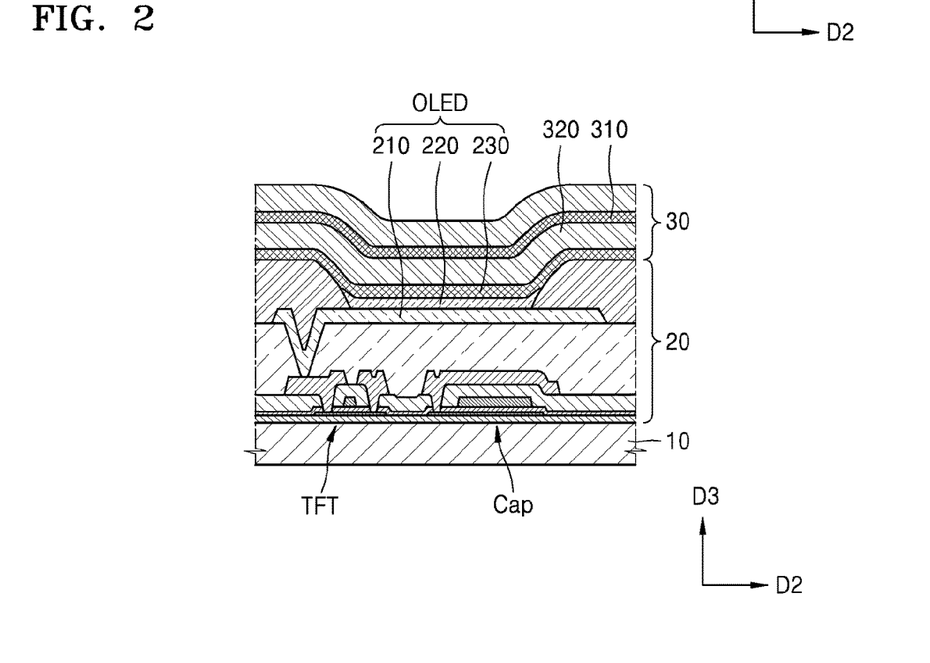
FIG. 2 is a cross-sectional view illustrating an encapsulation layer and an organic light-emitting device layer that corresponds to one of sub-pixels of the OLED display of FIG. 1.

FIG. 1 is a cross-sectional view of an OLED display according to an embodiment. FIG. 2 is a cross-sectional view illustrating an encapsulation layer 30 and an organic light-emitting device layer 20 that corresponds to one of sub-pixels of the OLED display of FIG. 1.

In the present embodiment, the OLED display includes a substrate 10, the organic light-emitting device layer 20, the encapsulation layer 30, an intermediate layer 40, and an optical film 80.

The substrate 10 may be formed of various materials including a glass material, a plastic material, or a plastic material including polyethylene terephthalate (PET), polyethylene naphthalate (PEN), or polyimide. If the substrate 10 is formed of the plastic material, the substrate 10 may have flexibility.

The organic light-emitting device layer 20 may be formed on the substrate 10 and may include a plurality of organic light-emitting devices OLEDs that emit lights of different colors. Each of the OLEDs may form a sub-pixel. For example, the OLED that emits red light may form a first sub-pixel P1, the OLED that emits green light may form a second sub-pixel P2, and the OLED that emits blue light may form a third sub-pixel P3.

Referring to FIG. 2, each of the OLEDs includes a pixel electrode 210, an emission layer 220, and an opposite electrode 230 and is electrically connected to a pixel circuit that includes a thin-film transistor TFT and a storage capacitor Cap so as to drive the corresponding organic light-emitting device OLED connected thereto.

The pixel electrode 210 may be a transparent (or translucent) electrode or a reflective electrode. If the pixel electrode 210 is a transparent (or translucent) electrode, the pixel electrode 210 may include at least one material selected from indium tin oxide (ITO), indium zinc oxide (IZO), zinc oxide (ZnO), indium oxide ($In_2O_3$), indium gallium oxide (IGO), and aluminum zinc oxide (AZO). If the pixel electrode 210 is a reflective electrode, the pixel electrode 210 may have a structure including a reflective layer that is formed of Ag, Mg, Al, Pt, Pd, Au, Ni, Nd, Ir, Cr, or a compound thereof and a layer that is formed of ITO, IZO, ZnO, or $In_2O_3$ on the reflective layer. However, the structure and materials of the pixel electrode 210 are not limited thereto, and thus, the pixel electrode 210 may be formed of other materials or may be a multiple-layer.

The emission layer 220 may include an organic material that emits red light, green light, and blue light. The organic material that emits light may be a low molecular weight or a high molecular weight organic material. According to a type of the organic material, at least one selected from a hole transport layer, a hole injection layer, an electron transport layer, and an electron injection layer may be formed on the emission layer 220.

The opposite electrode 230 may be commonly formed to extend over a plurality of sub-pixels. The opposite electrode 230 may be transparent (or translucent) electrode or a reflective electrode. If the opposite electrode 230 is a transparent (or translucent) electrode, the opposite electrode 230 may have a structure including a layer that is formed of Li, Ca, LiF/Ca, LiF/Al, Al, Mg or compound of any of these and a transparent (or translucent) layer that is formed of ITO, IZO, ZnO or $In_2O_3$ on the layer. If the opposite electrode 230 is a reflective electrode, the opposite electrode 230 may include at least one material selected from Li, Ca, LiF/Ca, LiF/Al, Al, Ag and Mg. However, the structure and materials of the opposite electrode 230 are not limited thereto, and thus, the opposite electrode 230 may be formed of other materials or may be multiple layers.

The encapsulation layer 30 may be formed on the organic light-emitting device layer 20 and thus may protect the organic light-emitting device layer 20 from foreign substances and/or exterior air. In an embodiment, the encapsulation layer 30 may be formed of a glass material, so that the encapsulation layer 30 and the substrate 10 may be bonded to each other by using a sealant. In another embodiment, as illustrated in FIG. 2, the encapsulation layer 30 may be formed by alternately stacking an inorganic layer 310 and an organic layer 320.

Referring to FIG. 1, the optical film 80 is formed on travel paths of lights that are emitted from the sub-pixels. For example, the optical film 80 is formed above the encapsulation layer 30, and the intermediate layer 40 is formed under the optical film 80. The optical film 80 may include a reflection control layer 50, a first lens 60 formed below the reflection control layer 50, and a second lens 70 formed on the reflection control layer 50.

Figure 6A:
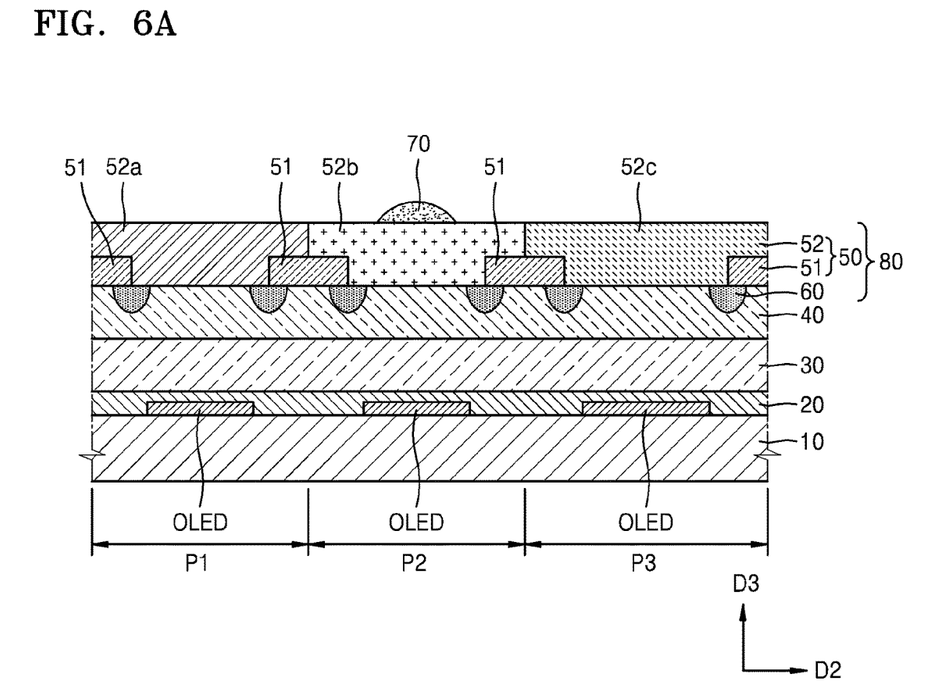
FIGS. 6A through 6C are cross-sectional views of an OLED display, according to another embodiment.
Figure 6B:
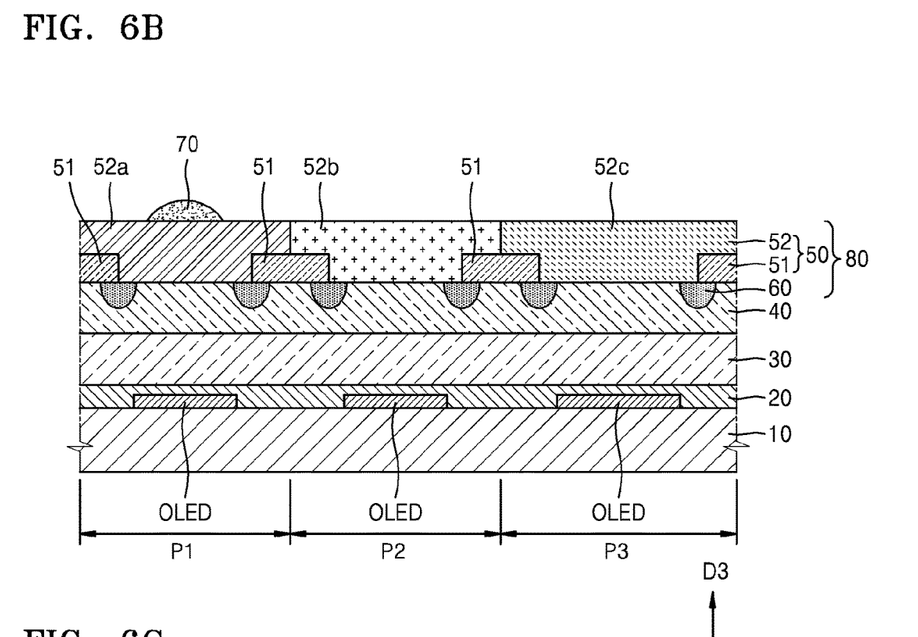

The reflection control layer 50 may include color filters 52 that respectively correspond to the sub-pixels, and light shielding parts 51 that are formed between adjacent sub-pixels (or between neighboring the color filters 52). For example, a red color filter 52a may be formed on the first sub-pixel P1 having the organic light-emitting devices OLED that emits red light, a green color filter 52b may be formed on the second sub-pixel P2 having the organic light-emitting devices OLED that emits green light, and a blue color filter 52c may be formed on the third sub-pixel P3 having the organic light-emitting devices OLED that emits blue light. As illustrated in FIGS. 1, 6A, and 6B, the light shielding parts 51 are formed between the color filters 52. For example, each light shielding part 51 may surround sides of each sub-pixel and thus may include a first opening OP1.

When external light is incident on the color filters 52, only a small portion of the incident external light is reflected, so that visibility of the external light and image resolution may be improved. The light shielding parts 51 may be arranged to reduce contrast due to bottom reflection of the external light and may include a black matrix that absorbs light having a wavelength in a visible range. Bottom reflection means that the external light is reflected by electrodes of the organic light-emitting device OLED, a wire layer, or the substrate 10 those are formed below the reflection control layer 50.

If a polarizing plate is used to decrease reflection of the external light, the manufacturing costs are increased, and since the thickness of the polarizing plate is relatively great, the OLED display including the polarizing plate is not bent. However, in the present embodiment, the reflection control layer 50 includes the color filters 52 and the light shielding parts 51. Thus, the reflection control layer 50 may be formed to be relatively thin compared to the polarizing plate, be flexible, and require low manufacturing costs.

The first lens 60 may be formed below the reflection control layer 50, and the second lens 70 may be formed on the reflection control layer 50. The first lens 60 may correspond to at least one of the first sub-pixel P1, the second sub-pixel P2, and the third sub-pixel P3, and may be formed to be adjacent to the light shielding part 51 of each sub-pixel. For example, the first lenses 60 may correspond to the first sub-pixel P1, the second sub-pixel P2, and the third sub-pixel P3, respectively.

The second lens 70 may be selectively formed according to pixels. For example, the second lens 70 corresponds to one of the first sub-pixel P1 and the second sub-pixel P2, and does not correspond to the third sub-pixel P3.

By doing so, the first lens 60 and the second lens 70 may compensate for a color impression of a side surface of the OLED display and may improve brightness of the side surface and overall luminescent efficiency of the OLED display. Hereinafter, with reference to FIGS. 3 through 5, the first lens 60 and the second lens 70 may be described in detail.

Figure 3:
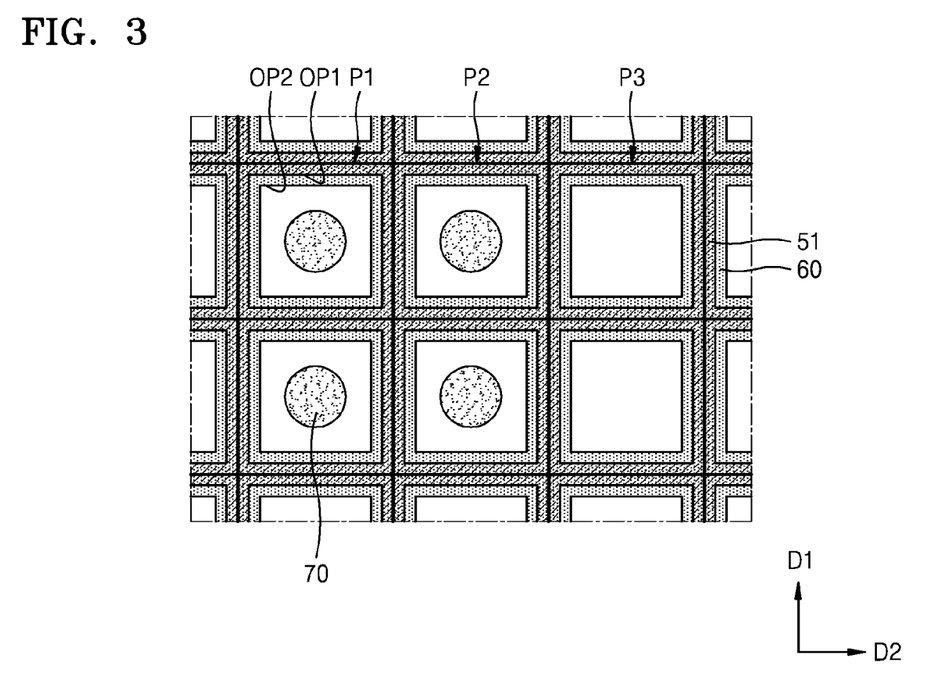
FIG. 3 is a plan view illustrating a layout of sub-pixels, a light shielding part, a first lens, and a second lens of the OLED display, according to an embodiment.
Figure 4A:
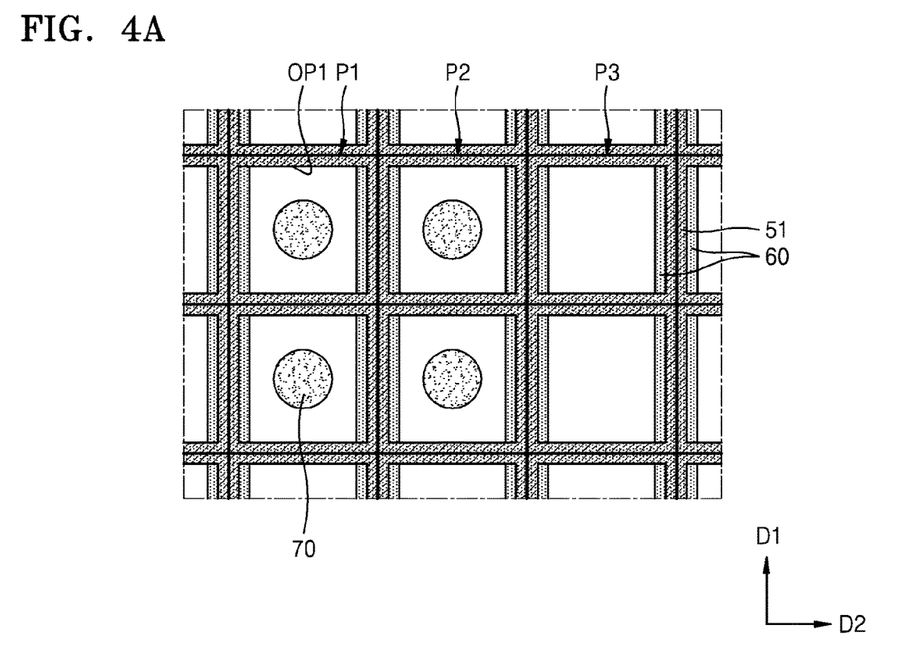
FIG. 4A is a plan view illustrating a layout of sub-pixels, a light shielding part, a first lens, and a second lens of the OLED display, according to another embodiment.
Figure 4B:
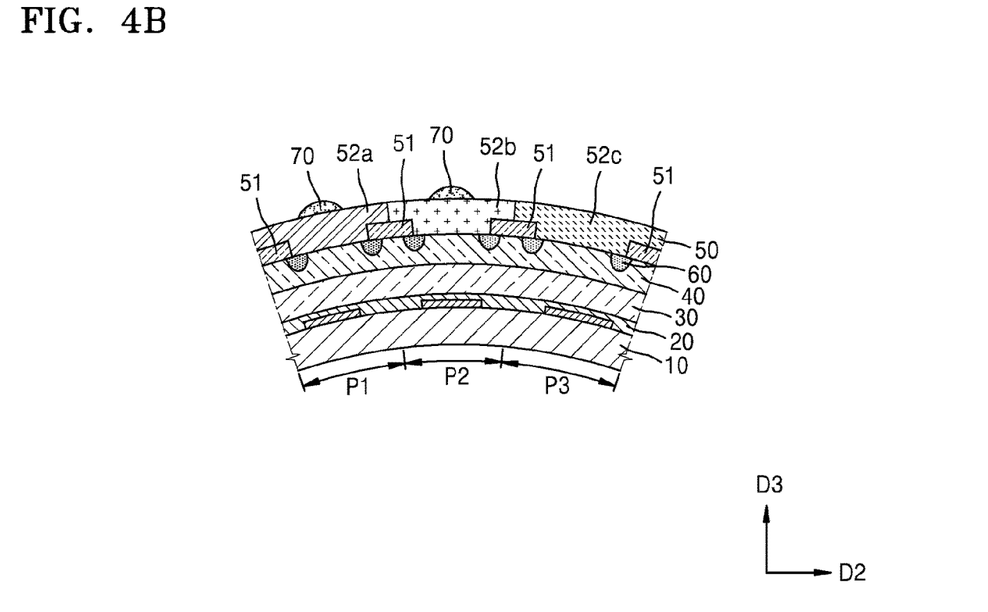
FIG. 4B is a cross-sectional side view illustrating a bent state of the OLED display of FIG. 4A.
Figure 5:
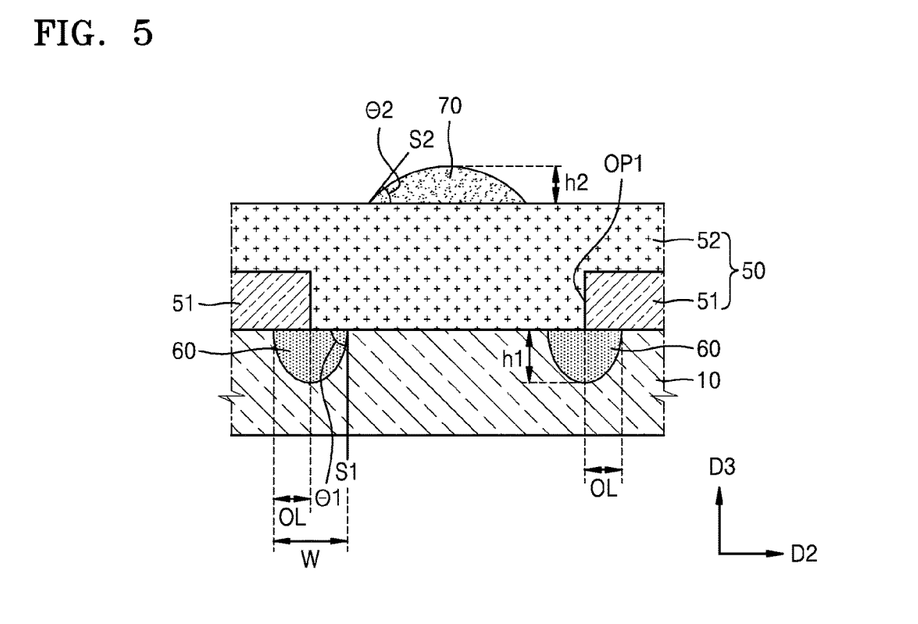
FIG. 5 is a cross-sectional view of an intermediate layer and an optical film that are formed on a sub-pixel of FIG. 1.

FIG. 3 is a plan view illustrating a layout of the first, second, and third sub-pixels P1, P2, and P3, the light shielding part 51, the first lens 60, and the second lens 70, according to an embodiment of the present invention. FIG. 4A is a plan view illustrating a layout of the first, second, and third sub-pixels P1, P2, and P3, the light shielding part 51, the first lens 60, and the second lens 70, according to another embodiment of the present invention. FIG. 4B is a cross-sectional side view illustrating a bent state of the OLED display of FIG. 4A. FIG. 5 is a cross-sectional view of the intermediate layer 40 and the optical film 80 that are formed on a sub-pixel of FIG. 1.

The first lens 60 may be formed to correspond to a side of at least one sub-pixel from among the first, second, and third sub-pixels P1, P2, and P3. The first lens 60 may be formed adjacent to the light shielding part 51 at a position that corresponds to a side of each sub-pixel. For example, as illustrated in FIG. 1, the first lens 60 may be formed to correspond to a side of each of the first, second, and third sub-pixels P1, P2, and P3.

The first lenses 60 may be formed at the sides of the first, second, and third sub-pixels P1, P2, and P3 and may include areas OL that partly overlap with the light shielding parts 51, respectively. Thus, the first lens 60 changes a travel path of light traveling toward the light shielding part 51 after being emitted from the OLED, thereby the light may be emitted outside.

The first lens 60 may have a convex surface protruding in an opposite direction of the travel path of the light (i.e., a D3 direction) and may be formed of a material having a relatively high refractive index. For example, the first lens 60 may be formed of a silicon-based material having a refractive index of between about 1.5 and about 1.9. On the other hand, the intermediate layer 40 that contacts the first lens 60 is formed of air (having a refractive index of 1) or an acryl-based material having a refractive index of between about 1 and about 1.4, thus, a portion of light that travels toward the light shielding part 51 after being emitted from the organic light-emitting device OLED may be refracted and thus may not be absorbed by the light shielding part 51 but may be emitted outside via the first opening OP1. In some embodiments, if the intermediate layer 40 is formed of a polymer material such as the acryl-based material having a refractive index of between about 1 and about 1.4, the intermediate layer 40 may function as a bonding layer.

Each of the first lenses 60 may be formed to correspond to sides of each of the sub-pixels and thus may at least partially surround the sides of each of the sub-pixels. In the present embodiment, as illustrated in FIG. 3, the first lens 60 may be formed while corresponding to the sides of each of the first, second, and third sub-pixels P1, P2, and P3 and thus may substantially entirely surround the sides of each of the first, second, and third sub-pixels P1, P2, and P3. As described above, a portion of the first lens 60 overlaps a portion of the light shielding part 51 and other portion of the first lens 60 do not overlap the light shielding part 51 and thus is exposed via the first opening OP1, so that a second opening OP2 that is formed due to the first lens 60 is smaller than the first opening OP1.

In another embodiment, when the first opening OP1 has a polygonal shape having at least four corners, the first lens 60 may be formed along at least two corners from among the at least four corners of the first opening OP1. For example, as illustrated in FIG. 4A, the first lens 60 may be formed along two parallel corners of the first opening OP1 having the polygonal shape. In this case, as illustrated in FIG. 4B, even when the OLED display is bent along a D2 direction, the first lens 60 is not broken.

The second lens 70 has a convex surface protruding toward with respect to a travel path of light (i.e., the D2 direction) that was emitted from the OLED, and diffuses the light that has passed through the reflection control layer 50.

The second lens 70 may be formed to correspond to a center portion of at least one sub-pixel of the first sub-pixel P1 and the second sub-pixel P2. For example, the second lens 70 is formed while corresponding to a center portion of each of the first sub-pixel P1 that emits red light and the second sub-pixel P2 that emits green light, and is not formed while corresponding to the third sub-pixel P3 that emits blue light.

In a comparative example of the present embodiment, if the optical film 80 includes only the reflection control layer 50 that includes the color filter 52 and the light shielding part 51, although light that is emitted from a blue color sub-pixel has an effect on an adjacent sub-pixel, the optical film 80 cannot control the effect. In this case, a bluish color may appear on a side surface of the OLED display.

However, in the present embodiment, the second lens 70 is formed while corresponding to the first and second sub-pixels P1 and P2 that emit red light and green light, respectively, so that the red light and green light further diffuse toward the side surface and thus the bluish color may be suppressed. Also, since the amount of light travels towards the side surface is increased due to the second lens 70, brightness of the side surface may be improved.

As described above, the first lens 60 changes the travel path of the light travels toward the light shielding part 51, and the second lens 70 diffuses the light. Since functions of the first lens 60 and the second lens 70 are different from each other, the first lens 60 and the second lens 70 may have different curvatures. The second lens 70 may have a curvature smaller than a curvature of the first lens 60 so as to allow diffusions to occur in various directions.

For example, as illustrated in FIG. 5, a height h1 of the first lens 60 may be between about 1.0 and about 5.0 μm, and an initial degree $\theta 1$ of the first lens 60 may be greater than about 40 degrees, and a height h2 of the second lens 70 may be greater than or equal to about 1.0 μm, and an initial degree $\theta 2$ of the second lens 70 may be greater than about 30 degrees. Here, the initial degree may indicate an angle between a surface along D2 direction that is substantially vertical to the travel path (D3) of the light, and a surface S1 (or a surface S2) that contacts a normal vector passing an end point of a convex surface of a lens.

In order to allow a portion of light to travel without passing through the first lens 60, wherein the portion of the light is emitted from the OLED and travels straight in the D3 direction, a width of the first lens 60 may be smaller than a half of a width of the first opening OP1.

The first lens 60 and the second lens 70 may not overlap each other. If the second lens 70 has a large width that overlaps a width of the first lens 60, a large portion of light that is externally emitted passes through the second lens 70. That is, diffusion occurs a lot at the side surface, such that luminescent efficiency at a front surface may deteriorate. In order to prevent the deterioration, the first lens 60 and the second lens 70 may not overlap each other.

Table 1 below shows simulation results regarding the luminescent efficiency of an OLED display according to the comparative example and the luminescent efficiency of the OLED display according to the present embodiment.

The OLED display according to the comparative example includes the encapsulation layer 30 formed on the organic light-emitting device layer 20 having a bluish color at a side surface, the intermediate layer 40, and an optical film including the color filter 52 and the reflection control layer 50 having a light shielding layer. On the other hand, the OLED display according to present embodiment includes the encapsulation layer 30 formed on the organic light-emitting device layer 20 having a bluish color at a side surface, the intermediate layer 40, and the optical film 80 including a structure as shown in FIG. 1.

TABLE 1

|  | Comparative example | Present embodiment |
| --- | --- | --- |
| Front luminescent efficiency | 100.0% | 84.0% |
| Overall luminescent efficiency | 100.0% | 129.1% |
| Color coordinates at a viewing angle of a side surface (CIEx, 60°) | 0.26 | 0.30 |

Referring to Table 1, when the overall luminescent efficiency of the OLED display according to the comparative example is 100%, although the front luminescent efficiency of the OLED display according to the present embodiment is 84.0%, the luminescent efficiency at a side surface of the OLED display according to the present embodiment is improved, so that the overall luminescent efficiency of the OLED display according to the present embodiment is increased to 129.1%.

Since the second lens 70 was formed at each of positions that correspond to a red sub-pixel and a green sub-pixel, red light and green light diffused and thus the front luminescent efficiency was decreased by about 26.0%, however, brightness of the side surface has been improved due to the second lens 70, and a large portion of light is not absorbed by the light shielding part 51 and but is externally emitted due to the first lens 60, so that the overall luminescent efficiency has been improved by about 29.1%. Also, a bluish color that occurred in the case of the OLED display according to the comparative example at a viewing angle of 60 degrees of the side surface has been suppressed. In Table 1, a higher value in the row of the color coordinates at a viewing angle of a side surface indicates whiter light.

Figure 6C:
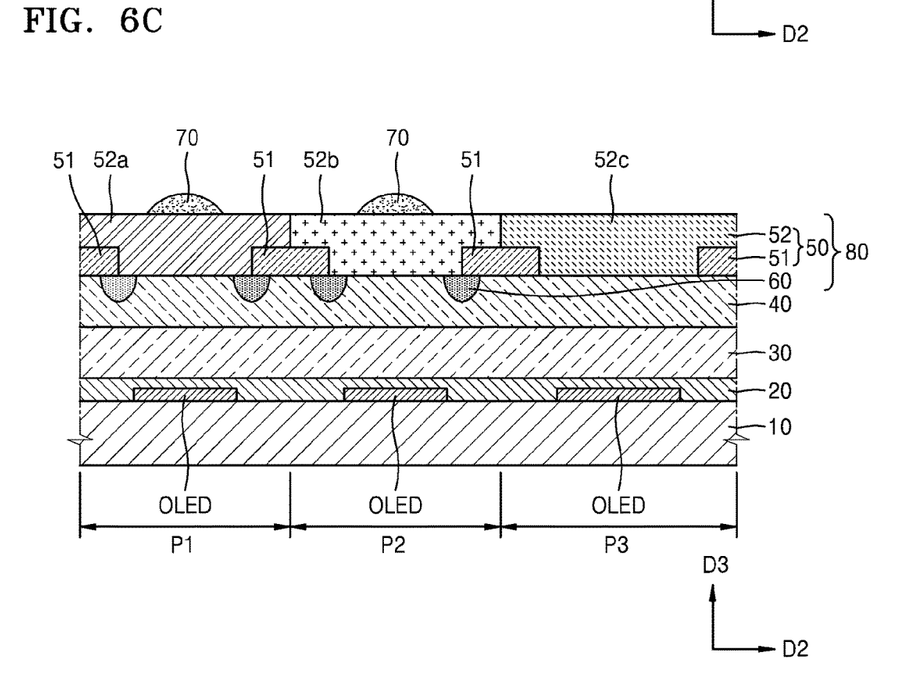

FIGS. 6A through 6C are cross-sectional views of an OLED display, according to another embodiment of the present invention.

As illustrated in FIGS. 6A through 6C, the second lens 70 may be formed so as to correspond to at least of a first sub-pixel P1 emitting red light and a second sub-pixel P2 emitting green light, and as illustrated in FIG. 6C, the first lens 60 may be formed only at the first sub-pixel P1 emitting red light and the second sub-pixel P2 emitting green light, not a third sub-pixel P3, in consideration of overall luminescent efficiency.

In the one or more embodiments mentioned above, the first sub-pixel P1 and the second sub-pixel P2 emit red light and green light, respectively, and the second lens 70 is formed to correspond to each of the first sub-pixel P1 and the second sub-pixel P2, so that a bluish color of a side surface of the OLED display is suppressed and brightness of the side surface is improved, but the described technology is not limited thereto.

According to a structure of a pixel circuit and a structure of the OLED that are included in the organic light-emitting device layer 20, the OLED display may express a bluish color, a reddish color, or a greenish color. However, according to the present embodiment, since the second lens 70 is selectively or differentially formed, a particular color impression of the side surface may be suppressed. In one embodiment, the first sub-pixel P1 and the second sub-pixel P2 emit green light and blue light, respectively, and the second lens 70 is formed so as to correspond to each of the first sub-pixel P1 and the second sub-pixel P2, so that a reddish color impression may be suppressed and brightness of the side surface may be increased. In another embodiment, the first sub-pixel P1 and the second sub-pixel P2 emit blue light and red light, respectively, and the second lens 70 is formed so as to correspond to each of the first sub-pixel P1 and the second sub-pixel P2, so that a greenish color impression may be suppressed and brightness of the side surface may be increased.

As described above, the OLED display according to at least one of the disclosed embodiments has improved luminescent characteristics.

It should be understood that the exemplary embodiments described therein should be considered in a descriptive sense only and not for purposes of limitation. Descriptions of features or aspects within each embodiment should typically be considered as available for other similar features or aspects in other embodiments.

While the inventive technology has been described with reference to the figures, it will be understood by those of ordinary skill in the art that various changes in form and details may be made therein without departing from the spirit and scope of the present invention as defined by the following claims.

What is claimed is:

1. An organic light-emitting diode (OLED) display, comprising:
 a plurality of sub-pixels;
 wherein each of the plurality of sub-pixels comprises:
  a substrate;
  an OLED layer disposed over the substrate and comprising an OLED;
  an encapsulation layer disposed over the OLED layer and comprising at least one inorganic layer and at least one organic layer;
  an intermediate layer disposed over the encapsulation layer and having a first refractive index; and a first lens layer disposed over the intermediate layer and comprising a first lens, wherein the first lens has a second refractive index greater than the first refractive index, wherein the first lens layer has a flat portion and a curved portion extending from the flat portion, and wherein the curved portion of the first lens layer is curved toward the intermediate layer.

2. The OLED display of claim 1, each of the plurality of sub-pixels further comprises:
   a color filter layer over the first lens layer and comprising a color filter; and
   a black matrix over the first lens layer and corresponding to a peripheral portion of the color filter.

3. The OLED display of claim 2, wherein a portion of the first lens overlaps the black matrix.

4. The OLED display of claim 3, wherein the remaining portion of the first lens overlaps the color filter.

5. The OLED display of claim 1, wherein the first refractive index is 1 or between about 1 and about 1.4.

6. The OLED display of claim 1, wherein the second refractive index is between about 1.5 and about 1.9.

7. The OLED display of claim 1, wherein the intermediate layer comprises an acryl-based material.

8. The OLED display of claim 1, wherein the first lens comprises a silicon-based material.

9. The OLED display of claim 1, wherein the first lens has a height between about 1.0 μm and about 5.0 μm.

10. The OLED display of claim 1, wherein the OLED comprises a pixel electrode, an emission layer over the pixel electrode and comprising an organic material, and an opposite electrode over the emission layer, and
   wherein the OLED is configured to emit a light along a direction from the pixel electrode toward the opposite electrode.

11. The OLED display of claim 10, the first lens satisfies expression below:

$$\theta 1 > 40°,$$

wherein θ1 denotes an initial angle between a first virtual surface that contacts a normal vector passing an end point of a convex surface of the first lens, and a second virtual surface that is substantially perpendicular to the direction of the light.

12. The OLED display of claim 10, wherein a part of the plurality of sub-pixels comprises a second lens.

13. The OLED display of claim 12, wherein the second lens does not overlap the first lens.

14. The OLED display of claim 12, wherein the second lens has a curvature less than that of the first lens.

15. The OLED display of claim 12, wherein the second lens has a height greater than or equal to about 1.0 μm.

16. The OLED display of claim 12, the second lens satisfies expression below:

$$\theta 2 > 30°,$$

wherein θ2 denotes an initial angle between a first virtual surface that contacts a normal vector passing an end point of a convex surface of the second lens, and a second virtual surface that is substantially perpendicular to the direction of the light.

17. The OLED display of claim 1, wherein the substrate is flexible.

18. The OLED display of claim 1, wherein the curved portion of the first lens layer is contacted and fully surrounded by the intermediate layer.

* * * * *